US012615793B2

(12) United States Patent
Santos Rodriguez et al.

(10) Patent No.: US 12,615,793 B2
(45) Date of Patent: Apr. 28, 2026

(54) POWER SEMICONDUCTOR DEVICE, METHOD OF PRODUCING A POWER SEMICONDUCTOR DEVICE AND METHOD OF OPERATING A POWER SEMICONDUCTOR DEVICE

(71) Applicant: Infineon Technologies AG, Neubiberg (DE)

(72) Inventors: Francisco Javier Santos Rodriguez, Villach (AT); Roman Baburske, Otterfing (DE); Hans-Joachim Schulze, Taufkirchen (DE); Daniel Schlögl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 360 days.

(21) Appl. No.: 18/361,260

(22) Filed: Jul. 28, 2023

(65) Prior Publication Data

US 2024/0047457 A1 Feb. 8, 2024

(30) Foreign Application Priority Data

Aug. 4, 2022 (DE) .......................... 102022119632.1

(51) Int. Cl.
*H10D 12/00* (2025.01)
*H10D 84/03* (2025.01)
(Continued)

(52) U.S. Cl.
CPC ......... *H10D 12/481* (2025.01); *H10D 84/038* (2025.01); *H10D 84/83* (2025.01);
(Continued)

(58) Field of Classification Search
CPC .... H10D 12/481; H10D 30/01; H10D 30/021; H10D 30/0212; H10D 30/0213;
(Continued)

(56) References Cited

U.S. PATENT DOCUMENTS

2020/0098903 A1 3/2020 Satoh

OTHER PUBLICATIONS

Harada, S., et al., "Optimal double sided gate control of IGBT for lower turn-off loss and surge voltage suppression", CIPS; 9th International Conference on Integrated Power Electronics Systems, Nuremberg, Germany, 2016, pp. 1-5.
(Continued)

*Primary Examiner* — Cheung Lee
(74) *Attorney, Agent, or Firm* — Murphy, Bilak & Homiller, PLLC

(57) ABSTRACT

A power semiconductor device includes at a first side and electrically isolated from first and second load terminals, first control electrodes for controlling a load current in first semiconductor channel structures formed in an active region at the first side, and at a second side and electrically isolated from the first and second load terminals, second control electrodes for controlling the load current in second semiconductor channel structures formed in the active region at the second side. At the second side and in a contiguous area of modified control (AMC) belonging to the active region and having a lateral extension of at least 30% of a thickness of a semiconductor body of the device, either no second control electrodes are provided or the second control electrodes are less effective in removing free charge carriers out of the power semiconductor device than the second control electrodes outside the AMC.

35 Claims, 7 Drawing Sheets

(51) Int. Cl.
    *H10D 84/83*     (2025.01)
    *H10D 88/00*     (2025.01)
    *H03K 17/567*     (2006.01)

(52) U.S. Cl.
    CPC ........... *H10D 88/01* (2025.01); *H10D 88/101*
    (2025.01); *H03K 17/567* (2013.01)

(58) Field of Classification Search
    CPC ........... H10D 30/0215; H10D 30/0217; H10D
    30/0221; H10D 30/023; H10D 30/0243;
    H10D 30/025; H10D 30/026; H10D
    30/027; H10D 30/0275; H10D 30/0277;
    H10D 30/0278; H10D 30/0413; H10D
    30/60; H10D 62/142; H10D 64/117;
    H10D 64/23; H10D 64/232; H10D
    64/512; H10D 84/01; H10D 84/038;
    H10D 84/811; H10D 84/817; H10D
    84/83; H10D 84/8311; H10D 84/8312;
    H10D 84/83125; H10D 84/83135; H10D
    84/83138; H10D 84/8314; H10D
    84/8316; H10D 84/832–833; H10D
    84/835; H10D 84/836; H10D
    84/837–839; H10D 88/01; H10D 88/101
    See application file for complete search history.

(56) References Cited

OTHER PUBLICATIONS

Tahir, H., et al., "A monolithically integrated bidirectional IGBT: Effect of spatial IGBT elementary cells repartitioning and technology of realization on device performance", Proceedings of 14th International Power Electronics and Motion Control Conference EPE-PEMC 2010, Ohrid, Macedonia, 2010, pp. T1-29-T1-33.

(II)

(I)

POWER SEMICONDUCTOR DEVICE, METHOD OF PRODUCING A POWER SEMICONDUCTOR DEVICE AND METHOD OF OPERATING A POWER SEMICONDUCTOR DEVICE

TECHNICAL FIELD

This specification refers to embodiments of a power semiconductor device, to embodiments of a method of producing a power semiconductor device, and to embodiments of a method of operating a power semiconductor device. In particular, this specification refers to a power semiconductor device having load current control structures at a first side of a semiconductor body and at a second side of the semiconductor body opposite to the first side, wherein the load current control structures at the second side may differ from the load current control structures at the second side, to embodiments of a corresponding production method and to embodiments of an associated operation method.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

The load current is typically conducted by means of an active region of the power semiconductor device. The active region is typically surrounded by an edge termination region, which is terminated by an edge of the chip.

To achieve a certain switching behavior and/or certain charge carrier distributions in the semiconductor during switching or during continuous ON (e.g., forward conduction) or OFF (e.g., forward blocking) states of the device, e.g., related to optimizing switching energies and/or saturation voltages, in addition to control electrodes at a front side of the semiconductor body, further control electrodes at a back side may be provided.

SUMMARY

According to an embodiment, a power semiconductor device comprises: a semiconductor body coupled to a first load terminal at a first side and to a second load terminal at a second side that is opposite to the first side with respect to a vertical direction, wherein the semiconductor body exhibits a thickness corresponding to the distance between the first side and the second side along the vertical direction and comprises an active region configured to conduct a load current between the first load terminal and the second load terminal. The power semiconductor device further comprises at the first side and electrically isolated from the first load terminal and the second load terminal, first control electrodes for controlling the load current in first semiconductor channel structures formed in the active region at the first side, and at the second side and electrically isolated from the first load terminal and the second load terminal, second control electrodes for controlling the load current in second semiconductor channel structures formed in the active region at the second side. At the second side and in a contiguous area of modified control, AMC, belonging to the active region and having a lateral extension of at least 30% of the semiconductor body thickness, either no second control electrodes are provided or the second control electrodes are less effective in removing free charge carriers out of the power semiconductor device (e.g., during turn-off of the power semiconductor device) than the second control electrodes outside the AMC.

According to a further embodiment, a power semiconductor device comprises a semiconductor body coupled to a first load terminal at a first side and to a second load terminal at a second side that is opposite to the first side with respect to a vertical direction, wherein the semiconductor body exhibits a thickness corresponding to the distance between the first side and the second side along the vertical direction and comprises an active region configured to conduct a load current between the first load terminal and the second load terminal. The power semiconductor device further comprises at the first side and electrically isolated from the first load terminal and the second load terminal, first control electrodes for controlling the load current in first semiconductor channel structures formed in the active region at the first side, and at the second side and electrically isolated from the first load terminal and the second load terminal, second control electrodes for controlling the load current in second semiconductor channel structures formed in the active region at the second side. The first control electrodes are arranged in first control trenches that extend from the first side into the semiconductor body along the vertical direction. The second control electrodes are formed as planar electrodes in a region below, with respect to the vertical direction, the second side.

According to a further embodiment, a method of producing a power semiconductor device comprises forming the following components: a) a semiconductor body coupled to a first load terminal at a first side and to a second load terminal at a second side that is opposite to the first side with respect to a vertical direction, wherein the semiconductor body exhibits a thickness corresponding to the distance between the first side and the second side along the vertical direction and comprises an active region configured to conduct a load current between the first load terminal and the second load terminal; b) at the first side and electrically isolated from the first load terminal and the second load terminal, first control electrodes for controlling the load current in first semiconductor channel structures formed in the active region at the first side, wherein the first control electrodes are arranged in first control trenches that extend from the first side into the semiconductor body along the vertical direction; and c) at the second side and electrically isolated from the first load terminal and the second load terminal, second control electrodes for controlling the load current in second semiconductor channel structures formed in the active region at the second side, wherein the second control electrodes are formed as planar electrodes in a region below, with respect to the vertical direction, the second side.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
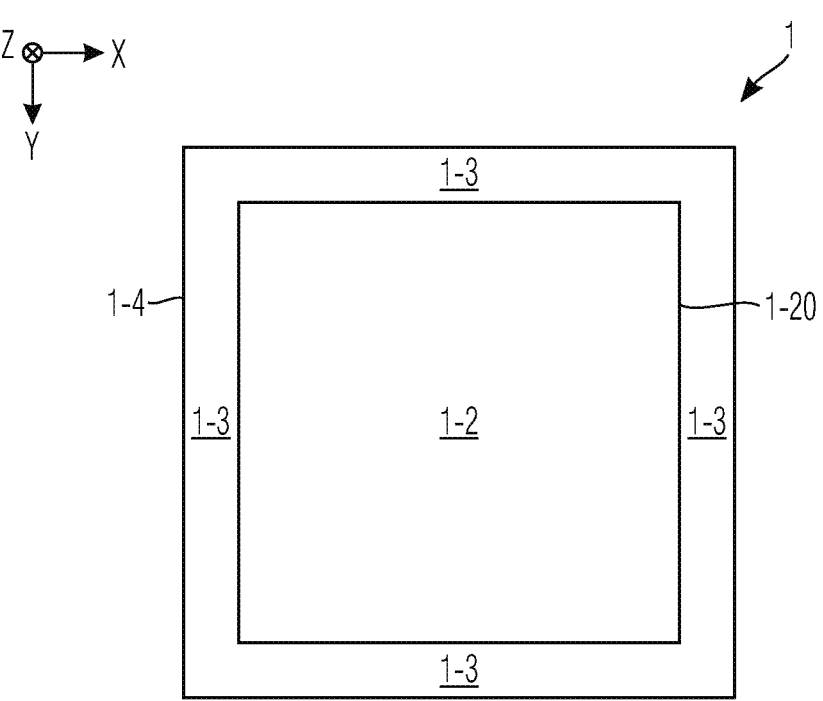
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled and/or electrostatically coupled (for example, in case of a junction). To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor unit cells, such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such cells may constitute a cell field that is arranged with an active region of the power semiconductor device.

The term "blocking state" of the power semiconductor device may refer to conditions, when the semiconductor device is in a state configured for blocking a current flow through the semiconductor device, while an external voltage is applied. More particularly, the semiconductor device may be configured for blocking a forward current through the semiconductor device while a forward voltage bias is applied. In comparison, the semiconductor may be configured for conducting a forward current in a "conducting state" of the semiconductor device, when a forward voltage bias is applied. A transition between the blocking state and the conducting state may be controlled by a control electrode or, more particularly, a potential of the control electrode.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more, depending on the respective application.

For example, the term "power semiconductor device" as used in this specification is not directed to logic semiconductor devices that are used for, e.g., storing data, computing data and/or other types of semiconductor-based data processing.

The present specification in particular relates to a power semiconductor device embodied as an IGBT or as an RC-IGBT, i.e., a bipolar power semiconductor transistor or a derivate thereof that is controlled based on insulated gate electrodes.

For example, the power semiconductor device described below may be implemented on a single semiconductor chip, e.g., exhibiting a stripe cell configuration or a cellular/needle cell configuration and can be configured to be employed as a power component in a low-, medium- and/or high voltage application.

FIG. 1 schematically and exemplary illustrates a section of a horizontal projection of a power semiconductor device 1 in accordance with one or more embodiments. FIGS. 2 to 5 schematically and exemplary illustrate corresponding sections of vertical cross-sections according to some embodiments. FIG. 6 illustrates an exemplary operation method. That is, the power semiconductor device 1 illustrated in FIG. 1 can be configured in accordance with one or more of the cross-sections illustrated in FIGS. 2 to 5 and/or operated in accordance with the method illustrated in FIG. 6.

The power semiconductor device 1 may for example exhibit an IGBT configuration or a derivative thereof, e.g., an RC-IGBT or an RB-IGBT configuration.

The power semiconductor device 1 comprises a semiconductor body 10 coupled to a first load terminal 11 at a first side 110 (cf. FIG. 2) and a second load terminal 12 at a second side 120 that is opposite to the first side 110 with respect to the vertical direction Z.

The semiconductor body 10 exhibits a thickness d corresponding to the distance between the first side 110 and the second side 120 along the vertical direction Z.

The power semiconductor body 10 comprises an active region 1-2 configured to conduct a load current between the first load terminal 11 and the second load terminal 12.

As illustrated in each of FIGS. 2 to 5, the semiconductor body 10 may be sandwiched between the first load terminal 11 and the second load terminal 12.

The power semiconductor device 1 may exhibit a vertical configuration, according to which the load current in active region 1-2 follows a path substantially in parallel to the vertical direction Z.

At a border line 1-20, the active region 1-2 transitions into an edge termination region 1-3, which is in turn terminated by a chip edge 1-4. That is, the edge termination region 1-3 surrounds the active region 1-2.

Herein, the terms 'active region' and 'edge termination region' are used with a technical context the skilled person typically associates with these terms. Accordingly, the active region's purpose is primarily to ensure load current conduction, whereas the edge termination region 1-3 is configured to reliably terminate the active region 1-2, e.g. in terms of courses of the electric field during conduction state and during blocking state.

The present specification primarily relates to the configuration of the active region 1-2, the production thereof and to the control of the load current therein.

Figure 2:
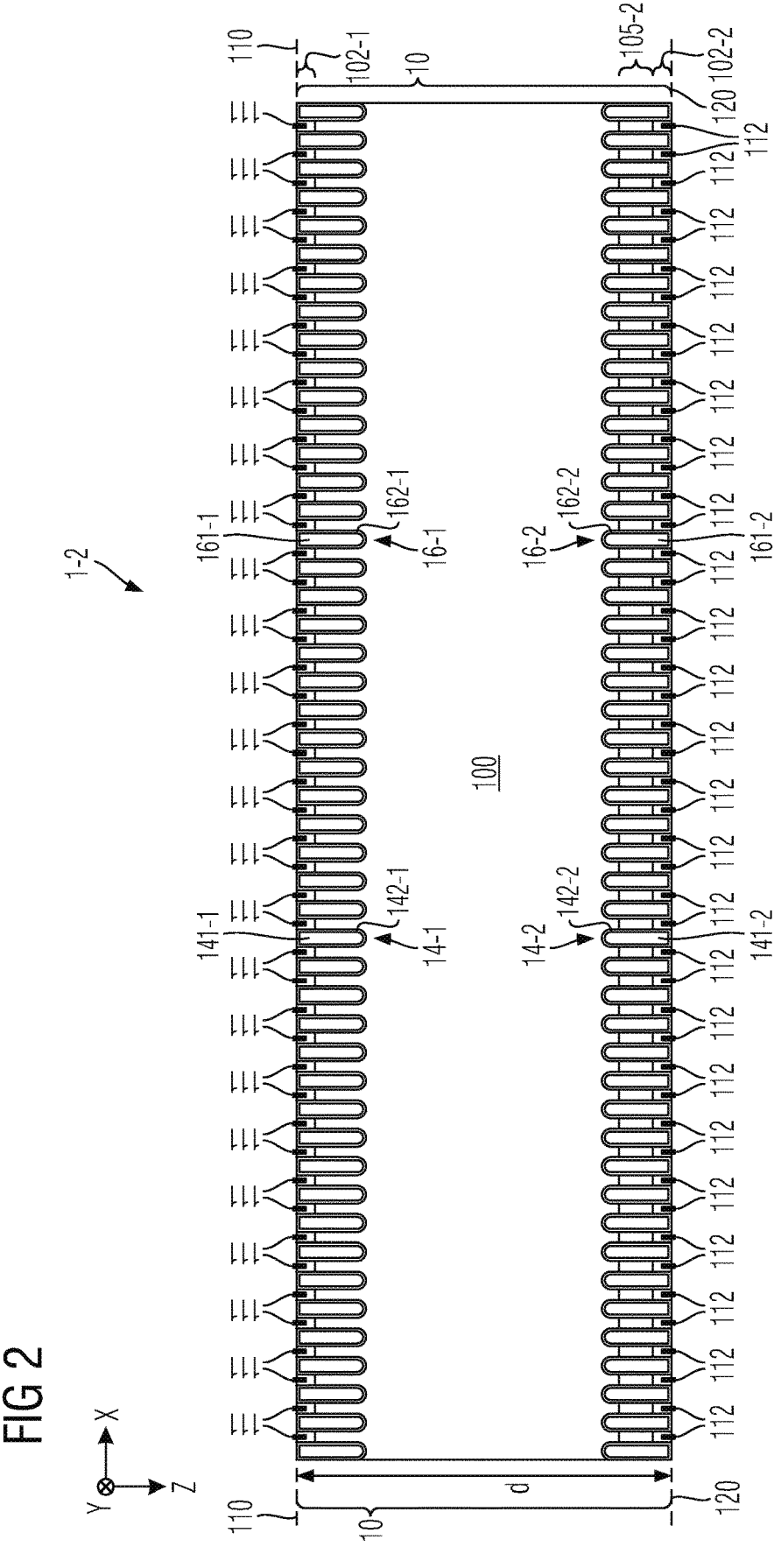
FIG. 2 schematically and exemplarily illustrates a section of a vertical cross-section of an active region of a power semiconductor device in accordance with one or more embodiments.

As illustrated in FIG. 2, at the first side 110 and electrically isolated from the first load terminal 11 and the second load terminal 12, the power semiconductor device 1 comprises first control electrodes 141-1 for controlling the load current in first semiconductor channel structures formed in the active region 1-2 at the first side 110.

Further, at the second side 120 and electrically isolated from the first load terminal 11 and the second load terminal 12, the power semiconductor device 1 further comprises second control electrodes 141-2 for controlling the load current in second semiconductor channel structures formed in the active region 1-2 at the second side 120.

For example, the first control electrodes 141-1 are configured to be subjected to a first control signal 13-1 (cf. FIG. 6) and the second control electrodes 141-2 are configured to be subjected to a second control signal 13-2 different from the first control signal. An exemplary method of operating the power semiconductor device 1 based on the first control signal 13-1 and the second control signal 13-2 will be explained with reference to FIG. 6.

As illustrated in FIG. 2, the first control electrodes 141-1 may be arranged in first control trenches 14-1 and insulated from the semiconductor body by first control insulators 142-1.

At the first side 110 and electrically connected to the first load terminal 11, the power semiconductor device 1 may optionally comprise source electrodes 161-1. The source electrodes 161-1 may be arranged in source trenches 16-1 and insulated from the semiconductor body by source insulators 162-1.

In an embodiment, in addition or in alternative to the source electrodes 161-1, the power semiconductor device 1 may, at the first side 110, comprise further electrodes, e.g., some of the second control electrodes 141-2 may also be arranged at the first side (e.g., also in trenches), and/or floating electrodes (e.g., also in trenches) and/or further control electrodes (e.g., also in trenches).

The first trenches 14-1, 16-1 at the first side 110 laterally confine first mesas, i.e., certain portions of the semiconductor body 10. In at least some of these mesas, the first semiconductor channel structures are formed. For example, each of the first semiconductor channel structures includes a portion of a first body region 102-1 of the second conductivity type electrically isolating a respective first source region 101-1 (cf. FIG. 5) of the first conductivity type from a drift region 100 of the first conductivity type. Both the respective first source region 101-1 and the respective first body region portion 102-1 may be electrically connected to the first load terminal 11, e.g., based on a respective first contact plug 111, as illustrated in FIG. 2.

The explanation above essentially applies also to the second side 120:

As illustrated in FIG. 2, the second control electrodes 141-2 may be arranged in second control trenches 14-2 and insulated from the semiconductor body by second control insulators 142-2. Instead of being housed in a trench, the second electrodes 141-2 may also be configured as planar electrodes below, with respect to the vertical direction Z, the second side 120, cf. FIG. 5. The configuration as planar electrodes is possible as, at least in some embodiments, the primary function of the second control electrodes 141-2 is to remove free charge carriers prior to and/or during a turn-off operation (which will be described below in more detail) and the design of these electrodes 141-2 may hence be kept simple. Further, the configuration as planar electrodes allows for simplified production of the power semiconductor device 1, which will also be described in greater detail below.

At the second side 120 and electrically connected to the second load terminal 12, the power semiconductor device 1 may optionally comprise field electrodes 161-2. The field electrodes 161-2 may be arranged in field trenches 16-2 and insulated from the semiconductor body by field insulators 162-2. If the second control electrodes 141-2 are configured as planar electrodes, the field electrodes 161-2 may be omitted or also be configured as planar electrodes. The field electrodes 161-2 may be connected to the second load terminal 11, e.g. collector or drain potential.

In an embodiment, in addition or in alternative to the field electrodes 161-2, the power semiconductor device 1 may, at the second side 120, comprise further electrodes, e.g., floating electrodes (e.g., also in trenches or as planar electrodes) and/or further control electrodes (e.g., also in trenches or as planar electrodes).

In an embodiment, if present, the second trenches 14-2, 16-2 at the second side 120 laterally confine second mesas, i.e., certain portions of the semiconductor body 10. In at least some of these mesas, the second semiconductor channel structures are formed.

Irrespective of whether the second semiconductor channel structures are formed in mesas or not, each of the second semiconductor channel structures includes a portion of a second body region 102-2 of the second conductivity type electrically isolating a respective second source region 101-2 (cf. FIG. 5) of the first conductivity type from the drift region 100 of the first conductivity type. Both the respective second source region 101-2 and the respective second body region portion 102-2 may be electrically connected to the second load terminal 12, e.g., based on a respective second contact plug 112, as illustrated in FIG. 2.

FIG. 2 illustrates that, at the first side 110, each mesa is electrically connected to the first load terminal 11 and, at the second side 120, each mesa is electrically connected to the second load terminal 11, wherein it shall be understood that this configuration is only exemplary. Also for this reason, only one respective reference sign is used to arbitrarily denote a first control trench 14-1 and a source trench 16-1 at the first side 110 and a second control trench 14-2 and a field trench 16-2 at the second side 120.

Based on the type of the trench (first/second control trench, first source trench, second field trench, floating trench) and based on the type of the mesa (equipped/not-equipped with one of the first/second semiconductor channel structures, connected/not-connected to the first/second load terminal 11/12), diverse trench-mesa-patterns may be formed at the first side 110 and the second side 120, e.g., according to one of the variants (i) clGlcS (ii) clGlcScScS (iii) clGlcSSGSS at the first side 110 and, at the second side 120, according to one of the variants (i) clG2

(ii) clG2lcC (iii) clGlcCCC (iv) clGlcF (v) cGcCcCcC

The abbreviations are defined as follows (the large letters denote trenches, the small letters mesas):

G=First control trench 14-1

G2=Second control trench 14-2

S=source trench 16-1

C=field trench 16-2

F=Trench housing floating electrode c=Mesa connected to the first/second load terminal l=first/second source region in mesa Hence, if a large letter directly follows a precedent large letter, the mesa between the corresponding trenches is not connected to the first/second load terminal. For example, regarding the second example (ii)—clGlcScScS—for the first side 110, the trench-mesa-pattern is defined by a repetitive arrangement, along the first lateral direction X, of a mesa connected to the first load terminal 11 and including one of the first semiconductor channel structures (cl), a first control trench 14-1 (G), another mesa connected to the first load terminal 11 and including one of the first semiconductor channel structures (lc), a source trench 16-1 (S), a mesa connected to the first load terminal 11 and not including one of the first semiconductor channel structures, but only a portion of the first body region 102-1 (c), a further source trench 16-1 (S), a further mesa connected to the first load terminal 11 and not including one of the first semiconductor channel structures, but only a portion of the first body region 102-1 (c) and a further source trench 16-1 (S), which then adjoins a further clGlcScScS structure and so forth.

Each of said trenches may exhibit a stripe configuration, according to which the respective trench extends along the second lateral direction Y for a significant greater total extension (i.e., length) as compared to the respective total extension in the first lateral direction X (i.e., width).

Herein, the semiconductor channel structure is used in a context the skilled person typically associates therewith. For example, based on providing said first/second control signal 13-1/2, an inversion channel may be induced or, respectively, cut-off, in the first/second body region portion 102-1/2 for controlling the load current, i.e., for controlling switching operations of the power semiconductor device 1. If the respective first/second control electrode 141-1/2 is arranged adjacent to a mesa electrically connected to the first/second load terminal 11/12 but only including a portion of the first/second body region 102-1/2 but not source region, i.e., no channel structure, the based on providing said first/second control signal 13-1/2, plasma, i.e., the spatial charge carrier distribution, may be controlled or at least influenced.

Some of the embodiments described herein are configured to reduce the risk of filaments, in particular at the second side 120. For example, the second control structures at the second side allow for removing charge carriers, e.g., for improving the turn-off operation. However, since a further space charge region at the second side may come into being, the risk of current filaments can be high. Such current filaments may lead to destruction of the power semiconductor device, similar to the known mechanisms observed for freewheeling diodes. That is, herein, a power semiconductor device shall be provided with control structures at both the first (e.g., front) side and at the second (e.g., back) side that exhibits high robustness, in particular during turn-off of the device. Furthermore, implementing the second electrodes 141-2/161-2 as planar electrodes may facilitate the production process for the semiconductor device 1. Also, such planar electrodes may facilitate providing desaturation at the second side 120.

Figure 3:
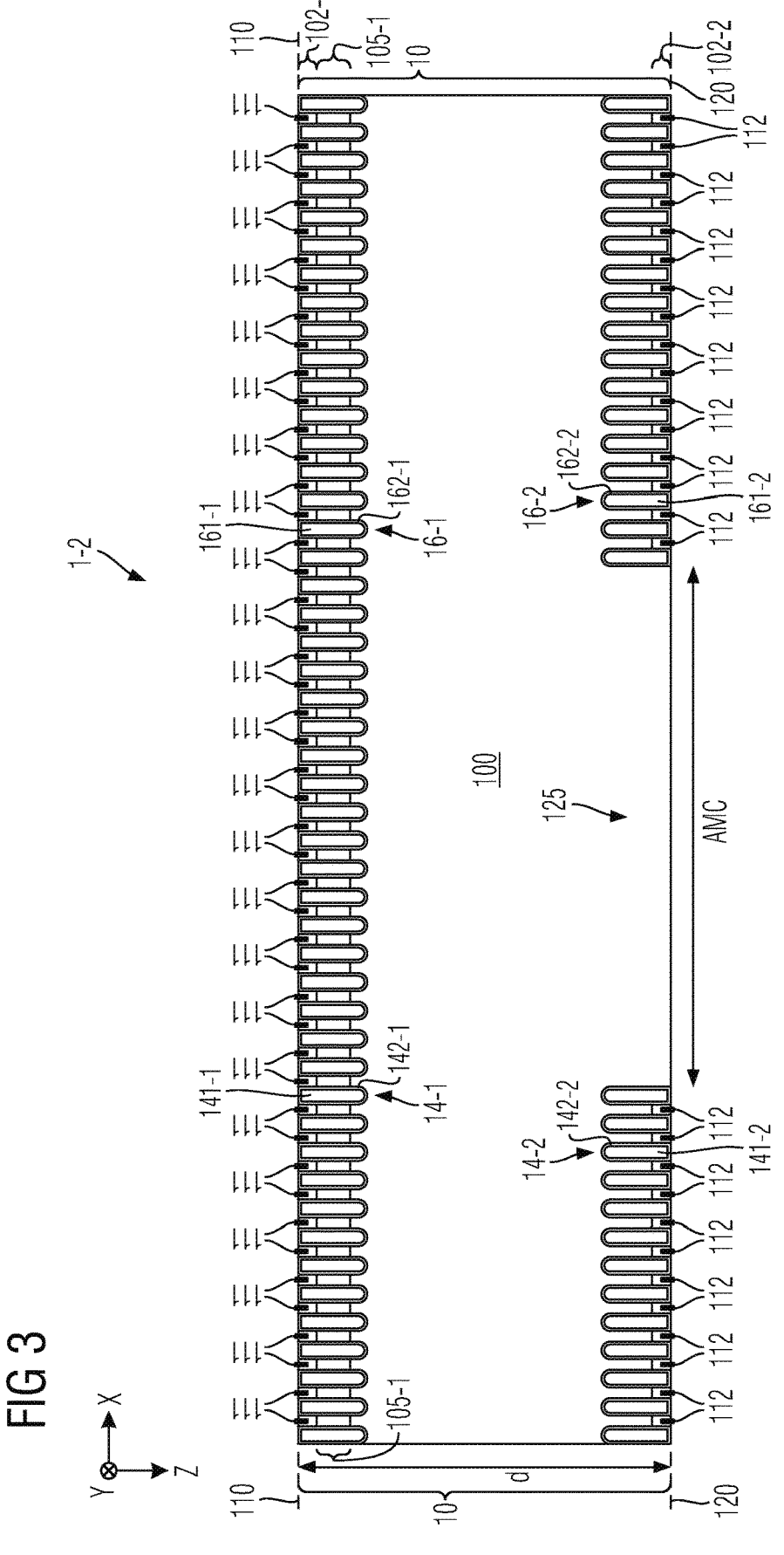
FIG. 3 schematically and exemplarily illustrates a section of a vertical cross-section of an active region of a power semiconductor device in accordance with one or more embodiments.
Figure 4:
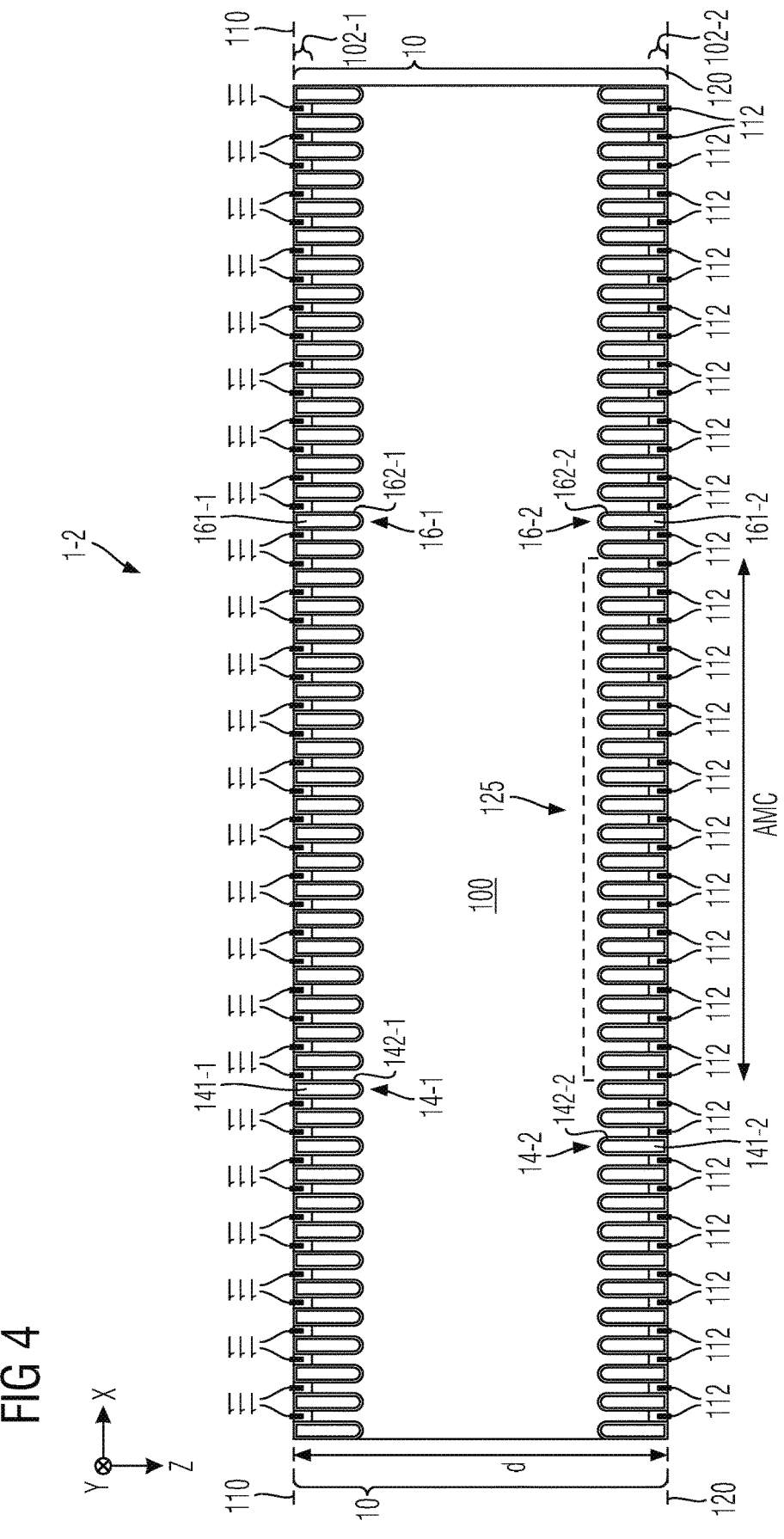
FIG. 4 schematically and exemplarily illustrates a section of a vertical cross-section of an active region of a power semiconductor device in accordance with one or more embodiments.

In accordance with an embodiment, at the second side 120 and in a contiguous area of modified control, AMC, 125 belonging to the active region 1-2 and having a lateral extension of at least 30%, 50% or even at least 100% of the semiconductor body thickness d, either no second control electrodes 141-2 (cf. FIG. 3) are provided or the second control electrodes 141-2 are less effective in removing free charge carriers out of the power semiconductor device 1 (e.g., during turn-off of the power semiconductor device 1) than the second control electrodes 141-2 outside the AMC 125 (cf. FIG. 4 and further explanations thereof below). Such design still allows for removing free charge carriers, but the risk of current filaments is reduced since the occurrence of a further space charge region is inhibited, according to an embodiment. Rather, the charge carrier plasma remains before the second body region 102-2.

The AMC 125 can have a total horizontal area amounting to at least 20%, 50% or 60% of the total horizontal area of the active region 1-2. For example, the AMC 125 is arranged centrally in the active region 1-2 and laterally surrounded by the remaining area of the active region 1-2 that is subjected to "normal" control based on the second control electrodes 142-2.

Specifically, at the second side 120, the AMC 125 may be surrounded by a portion of the active region 1-2 where the second control electrodes 141-2 are provided or, respectively, where the second control electrodes 141-2 are more effective in removing free charge carriers out of the power semiconductor device 1 (e.g., during turn-off of the power semiconductor device 1) than the second control electrodes 141-2 in the AMC 125.

In an embodiment, the power semiconductor device includes more than one AMC. For example, the plurality of AMCs may be distributed at the second side. For example, the total area of the AMCs is within the range of 20% to 80% of the total horizontal area of the active region 1-2.

Like the area that is "normally" controlled based on the second control electrodes 142-2, the AMC(s) 125 may provide for a path for the load current between the semiconductor body 10 and the second load terminal 12. That is, at least portions of the AMC 125 may be electrically connected to the second load terminal 12, e.g., based on number of said second contact plugs 112.

In an embodiment, as illustrated in FIG. 3, the power semiconductor device 1 further comprises a first barrier region 105-1 of the same conductivity type as the drift region 100 of the semiconductor body 10, wherein the first barrier region 105-1 is arranged, with respect the vertical direction Z, below the first semiconductor channel structures and above the drift region 100.

The dopant concentration of the first barrier region 105-1 may be in average at least twice as great or even more than five times greater than the dopant concentration of the drift region 100. For example, the first barrier region 105-1 interfaces with the first body region 102-1 and extends along the vertical direction Z, e.g., approximately as far as 90% of the average depths of the first trenches 14-1/16-1 at the first side 110.

In addition or in alternative to the first barrier region 105-1, the power semiconductor device 1 may further comprises a second barrier region 105-2 of the same conductivity type as the drift region 100, wherein the second barrier region 105-2 is arranged, with respect the vertical direction Z, above the second semiconductor channel structures and below the drift region 100.

The dopant concentration of the second barrier region 105-2 may be in average about twice as great or even five times greater than the dopant concentration of the drift region 100. For example, the second barrier region 105-2 interfaces with the second body region 102-2 and extends against the vertical direction Z, e.g., approximately as far as 90% of the average "depths" (heights, respectively) of the second trenches 14-2/16-2 at the first side 110. For example, the second barrier region 105-2 has a total vertical extension of less than 7 μm, less than 4 μm, less than 2 μm or even less than 1 μm. For example, if the dopants at the second side 120 are activated based on a Low-Temperature-Anneal (LTA) processing step, the total extension of the second barrier region 105-2 is comparatively small, e.g., less than 2 μm or even less than 1 μm.

Additionally, the power semiconductor device 1 may comprise a (non-illustrated) field stop region of the same conductivity type as the drift region 100, wherein the field stop region is arranged between the first barrier region 105-1 and the drift region 100 and/or between the drift region 100 and the second barrier region 105-2.

The dopant concentration of the field stop region may be in average about at least three times or even more than five times greater than the dopant concentration of the drift region 100. For example, the first barrier region 105-1 interfaces with the field stop region, which may extend along the vertical direction Z, e.g., along a distance corresponding to approximately as far as 3% to 35% of thickness d of the semiconductor body 10. Additionally or alternatively, the second barrier region 105-2 interfaces with the (additional/alternative) field stop region, which may extend against the vertical direction Z, e.g., along a distance corresponding to approximately as far as 3% to 35% of thickness d of the semiconductor body 10.

Regarding all embodiments described herein, the semiconductor body 10 may be formed in a single semiconductor chip and the power semiconductor device 1 can be an IGBT, optionally a bidirectional IGBT or a reverse conducting (RC) IGBT.

Still regarding all embodiments, the first control electrodes 141-1 (and, if implemented, the source electrodes 161-1 and second control electrodes 141-2) at the first side 110 may be accommodated in respective trenches, as illustrated in FIGS. 2 to 5. By contrast, deviating from the illustrations in FIGS. 2 to 4, the second control electrodes 141-2 (and, if implemented, the field electrodes 161-2) at the second side 110 may be implemented as planar electrodes, i.e., not accommodated in respective trenches, as explained above and illustrated in FIG. 5.

Figure 5:
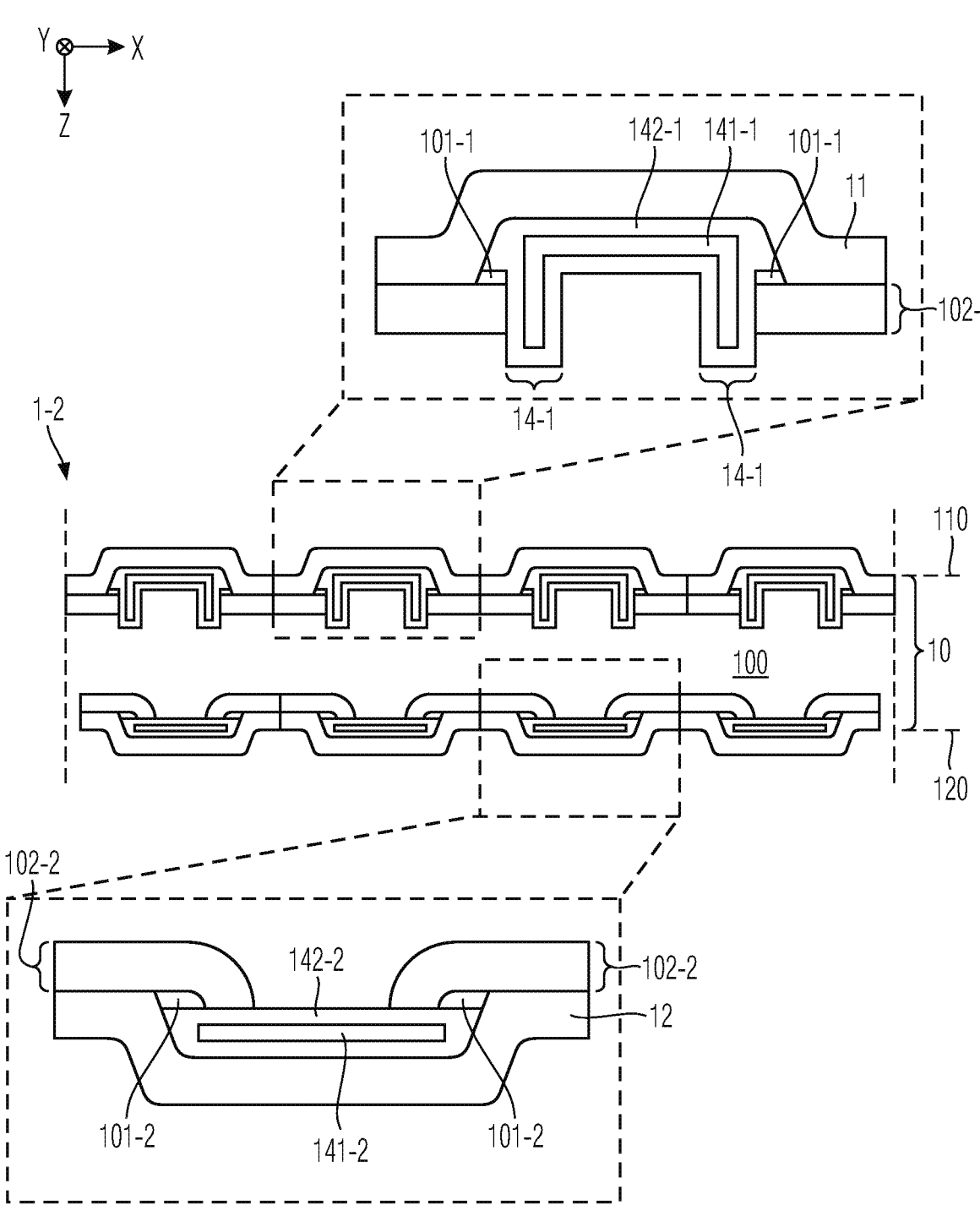
FIG. 5 schematically and exemplarily illustrates a section of a vertical cross-section of an active region of a power semiconductor device in accordance with one or more embodiments.
Figure 6:
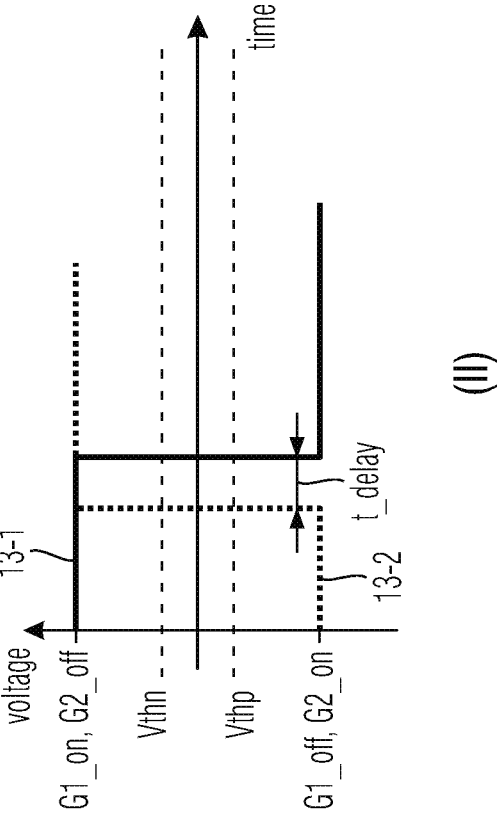
FIG. 6 schematically and exemplary illustrates a method of operating a power semiconductor device in accordance with one or more embodiments.
Figure 6:
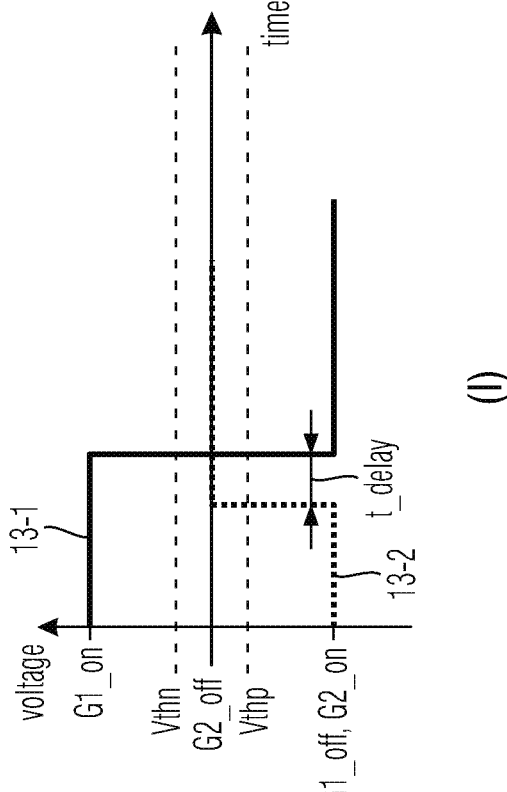

Regarding the upper portion of FIG. 5, i.e., the first side 110, the first control electrode 141-1 extends into two first trenches 14-1. Adjacent to each of these two first trenches 14-1, said first source regions 101-1 are implemented. Together with the first body region portions 102-1 below thereof, these form the first semiconductor channel structures which may be controlled by subjecting the first control electrode 141-1 to the first control signal 13-1, which may for example be generated by applying a first control voltage between the first load terminal 11 and a (non-illustrated) first control terminal electrically connected to the first control electrodes 141-1.

Regarding the lower portion of FIG. 5, i.e., the second side 120, the second control electrode 141-2 does not extend into a trench, but is implemented as a planar electrode. Above the second control insulator 142-2, said second source regions 101-2 are implemented. Together with the second body region portions 102-2 above thereof, these form the second semiconductor channel structures which may be controlled by subjecting the second control electrode 141-2 to the second control signal 13-2, which may for example be generated by applying a second control voltage between the second load terminal 11 and a (non-illustrated) second control terminal electrically connected to the second control electrodes 141-2.

The exemplary configuration described with respect to FIG. 5 can in particular be combined with the configurations that include the AMC at the second side. Furthermore, it shall be understood that also the first electrodes 141-1/161-1 (and optional other electrodes) at the first side 110 may be configured as planar electrodes. That is, none of the electrodes must necessarily be arranged within a trench.

To achieve the reduced effectiveness of the second control electrodes 141-2 in the AMC compared to the effectiveness of the second control electrodes 141-2 at the second side 120 outside of the AMC, one or more of the following may be applied in the AMC:

(i) The portion of the second body region 102-2 within the AMC has a higher dopant concentration as compared the portion of the second body region 102-2 outside of the AMC. This increases the relevant threshold voltage and, accordingly, the charge carrier plasma is removed to a lesser extent and/or a later point in time in the AMC. For example, the portion of the second body region 102-2 within the AMC has a dopant concentration amounting to at least 120%, 150% or even at least 180% of the dopant concentration of the portion of the second body region 102-2 outside of the AMC.

(ii) The spatial density of the second control electrodes 141-2 within the AMC is lower than the spatial density of the second control electrodes 141-2 outside of the AMC.

(iii) The average or total channel width of the second semiconductor channel structures within the AMC is lower than the average or total channel width of the second semiconductor channel structures outside of the AMC.

(iv) The average or total distance between the second semiconductor channel structures and the second control electrodes 141-2 within the AMC is greater than the average or total distance between the second semiconductor channel structures and the second control electrodes 141-2 outside of the AMC.

(v) The portion of the second barrier region 105-2 within the AMC has a lower dopant concentration as compared the portion of the second barrier region 105-2 outside of the AMC. The reduction of the dopant concentration of the second barrier region 105-2 increases the hole injection efficiency and, accordingly, the charge carrier plasma is removed to a lesser extent and/or a later point in time in the AMC. For example, the portion of the second barrier region 105-2 within the AMC has a dopant concentration amounting to at most 80%, 50% or even at most 30% of the dopant concentration of the portion of the second barrier region 105-2 outside of the AMC.

According to an embodiment, the power semiconductor device 1 is devoid of a wafer-bonding interface. For example, the semiconductor body 10 of the power semiconductor device 1 does not include a wafer-bonding interface. For example, the power semiconductor device 1 is based on a single thin wafer that has not been subjected to a wafer-bonding processing step. A method of producing an embodiment of the power semiconductor device 1 is described further below.

According to an embodiment, a further AMC is provided also at the first side. For example, at the first side 110 and in a further contiguous area of modified control, AMC' belonging to the active region 1-2 and having a lateral extension of at least 30%, 50% or 80% of the semiconductor body thickness d, either no first control electrodes 141-1 are provided or the first control electrodes 141-1 are less effective in removing free charge carriers out of the power semiconductor device 1 (e.g., during turn-off of the power semiconductor device 1) than the first control electrodes 141-1 outside the further AMC'. The effectiveness of the first control electrodes 141-1 may be reduced in a manner as explained for the second control electrodes 141-2.

Described herein is also a method of operating a power semiconductor device, e.g., an embodiment of the power semiconductor device 1 presented above. For example, referring to FIG. 6, the method comprises: providing both the first control signal 13-1 and the second control signal 13-2 with a respective first value G1_on, G2_on to maintain a forward conduction state of power semiconductor device 1 while the power semiconductor device 1 is forward-biased; and changing the respective first value G1_on; G2_on of both the first control signal 13-1 and the second control signal 13-2 to a respective second value G1_off; G2_off to transit from the forward conduction state to a forward blocking state while the power semiconductor device 1 is forward-biased. For example, the value of the first control signal G1_on is changed after a time delay t_delay with respect to the change of the value of the second control signal 13-2 (as illustrated in both variants (I) and (II) of FIG. 6).

The time delay t_delay may be within the range of 50% to 5000% of the total switching period, e.g., the time delay t_delay may be within the range of 1 is to 50 is and/or depend on the thickness of the semiconductor body 10. For example, assuming a thickness of 60 μm, the time delay t_delay may be within the range of 1 . . . 3 μs, and in case of a 120 μm thickness, the time delay t_delay may be within the range of 2 . . . 6 μs. Assuming a 600 μm thickness, the time delay t_delay may be within the range of 10 . . . 30 μs. For example, the minimum time delay t_delay_min (in μs) and the maximum time delay t_delay_max (in μs), i.e., the range, can be determined according to the following:

$$t_{delay\_min}(\mu s) = thickness(\mu m)/60,$$

$$t_{delay\_max}(\mu s) = thickness(\mu m)/20.$$

13

The time delay t_delay causes commencement of the removing of free charge carriers prior to the actual turn-off of the power semiconductor device 1 based on the first control signal 13-1. As explained above, according to some embodiments, such removal occurs to a lesser extend within the AMC 125 as compared to the outside of the AMC 125, since within the AMC 125, there are either no second control electrodes 141-2 provided or, respectively, the second control electrodes 141-2 within the AMC 125 are less effective in removing free charge carriers than the second control electrodes 141-2 outside the AMC 125.

In an embodiment, each second control electrode 142-2 receives the same second control signal 13-2. That is, both the AMC 125 and the non-AMC at the second side are subjected to the same second control signal 13-2. That is, the modified control in the AMC 125 is (at least) not (only) achieved based on providing a modified control signal, but based on a modified control structure, as explained above. However, it is also possible to combine the modified control structure with a modified control scheme within the AMC 125.

In an embodiment, the difference between the first value G2_on and the second value G2_off of the second control signal 13-2 is smaller as compared to the difference between the first value G1_on and second value G1_off of the first control signal 13-1, as illustrated in variant (I) of FIG. 6 (according to variant (II), said differences are substantially equal to each other). If said differences are substantially equal to each other, this allows for a simplified design of the driver which provides the second control signal 13-2.

It may be beneficial, e.g., in case of the power semiconductor device 1 being implemented as reverse conducting IGBT, if the second body region 102-2 at the second side is interrupted by (non-illustrated) second regions of the first conductivity type, wherein the area portion occupied by these second regions may amount to more than 5%, 10% or even more than 25% with respect to total area available at the second side 120 in the active region 1-2.

In reverse mode of the power semiconductor device 1, the second control signal 13-2 may be constant at a level approximately of more than Vthn (e.g., 15 V) or pulsed in such a way that the level of the second control signal 13-2 is greater than Vthn in the conduction state and such that the level of the second control signal 13-2 is smaller than Vthn before or during the reverse recovery (i.e., before/during turn-off in the reverse mode).

In an embodiment, the time difference for the switching of the first and the second control signals 13-2 and 13-1 is the same or smaller as specified for the desaturation in the forward mode (i.e., t_delay mentioned above).

It is noted that if embodied as RC-IGBT, the power semiconductor device 1 may form one of the two switches of a half bridge circuit, and the other switch may also be implemented as the power semiconductor device 1 embodied as RC-IGBT.

Furthermore, irrespective of the implementation, during turn-on of the power semiconductor device 1, it may be proceeded as follows:

providing both the first control signal 13-1 and the second control signal 13-2 with the respective second value G1_off/G2_off to maintain a forward blocking state of power semiconductor device 1 while the power semiconductor device 1 is forward-biased; and changing the respective second value G1_off/G2_off of both the first control signal 13-1 and the second control signal 13-2 to the respective first value G1_on/G2_on to transit from the forward conduction state to a forward blocking state while the power semiconductor device 1 is forward-biased, wherein the value of the first control signal 13-1 is changed before, at or after a change of the value of the second control signal 13-2.

For turning-on the device 1, the first and the second control signal 13-1/13-2 may be in synchronization or there is a time shift between the two changes. For example, the second control signal 13-2 is changed, not after modifying the first control signal 13-1, from G2_off to G2_on to induce a high hole current in the direction from the second side 120 to the first side 110. The time shift may be as long or shorter as the t_delay mentioned above for the turn-off process. The time shift may also be zero, i.e., first and the second control signal 13-1/13-2 may be changed simultaneously. Or, in order to avoid a strong hole current, the first control signal 13-1 is changed first from G1_off to G1_on, and the change of the second control signal 13-2 from G2_off to G2_on follows after a time shift.

Figure 7:
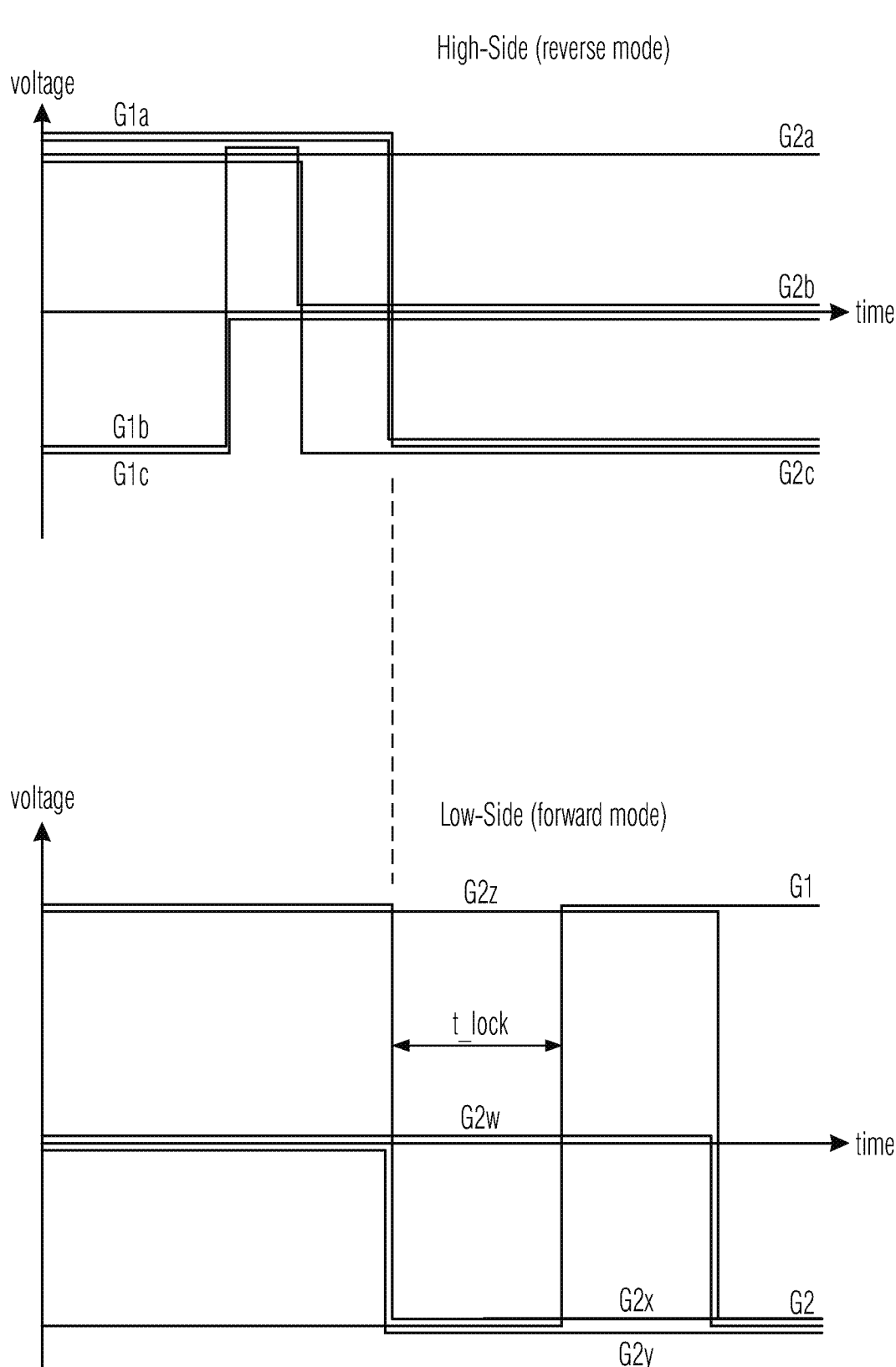
FIG. 7 schematically and exemplary illustrates a method of operating a half-bridge circuit in accordance with one or more embodiments.

Here, it shall be noted, as pointed out above, that the power semiconductor device 1 may be embodied as an IGBT or RC-IGBT. Based on two such devices, a half-bridge circuit may be formed. FIG. 7 illustrates exemplary switching processes therefore and is related to both the device forming the high-side in inverse mode and the device forming the low-side in forward mode. Several variants are illustrated: For the high-side, the second control signal 13-2 may follow one of courses G2a (constant), G2b (pulsed) and G2c (pulsed), and the first control signal 13-1 may follow one of courses G1a, G1b and G1c: For the low-side, the second control signal 13-2 may follow one of courses G2w, G2x, G2y and G2z (all terminating in course G2), and the first control signal 13-1 may follow course G1.

Regarding the low-side (turn on), the second control signal 13-2 (G2) may be switched before the first control signal 13-1 (G1), e.g., to achieve a higher hole current from the second side 120 to the first side 110 during turn on, cf. courses G2x and G2y. The corresponding time delay t_lock may be smaller than t_delay illustrated in FIG. 6. Or, the second control signal 13-2 (G2) may be simultaneously with the first control signal 13-1 (G1) or afterwards in order to avoid said high hole higher hole current from the second side 120 to the first side 110 during turn on, cf. courses G2w and G2z.

Generally, based on the second control signal 13-2 (G2), also the velocity of the turn on process may be controlled. Further, based on the second control signal 13-2 (G2), also the leakage current during blocking mode may be controlled.

According to an embodiment, the illustrated value Vthn is threshold voltage for the formation of the n-channel in the second body region 102-2 and may be within the range of 0.3 V to 7 V, e.g., between 4 V and 6 V.

According to an embodiment, the illustrated value Vthp is the threshold voltage for the formation of a p-channel, e.g., at a Si-oxide interface below the second body region 102-2, e.g. in the second barrier region 105-2 (if implemented) and may be within the range of –6 V to 2 V, e.g., within –5 V and –2 V.

In some embodiment, G1_on is greater than Vthn. Further, G2_off may also be greater than Vthn, as illustrated in variant (II) of FIG. 6. In another embodiment, G2_off is smaller than Vthn, e.g., 0 V, as illustrated in variant (I) of FIG. 6. Both G1_off and G2_on may be smaller than Vthp, e.g., both G1_off and G2_on may be around –15 V.

In an embodiment, a stationary forward conduction state of the power semiconductor device 1 is maintained if first control signal 13-1 is set to G1_on, e.g., +15 V, and if the second control signal 13-2 is set to G2_on, e.g., −15 V. Further, a stationary forward blocking state of the power semiconductor device 1 is maintained if first control signal 13-1 is set to G1_off, e.g., −15 V, and if the second control signal 13-2 is set to G2_off, e.g., either 0 V or +15 V. That is, based on the second control signal 13-2 provided to the second control electrodes 141-2, free charge carriers may be removed, e.g., when the second control signal 13-2 is provided with a voltage G2_off, which may for example be either 0 V or +15 V. For the forward conduction state, the second control signal 13-2 is provided with a voltage G2_off, which may for example be −15 V.

According to a further embodiment, a method of producing a power semiconductor device comprises forming the following components:

a) a semiconductor body coupled to a first load terminal at a first side and to a second load terminal at a second side that is opposite to the first side with respect to a vertical direction, wherein the semiconductor body exhibits a thickness corresponding to the distance between the first side and the second side along the vertical direction and comprises an active region configured to conduct a load current between the first load terminal and the second load terminal;

b) at the first side and electrically isolated from the first load terminal and the second load terminal, first control electrodes for controlling the load current in first semiconductor channel structures formed in the active region at the first side, wherein, optionally, the first control electrodes are arranged in first control trenches that extend from the first side into the semiconductor body along the vertical direction; and c) at the second side and electrically isolated from the first load terminal and the second load terminal, second control electrodes for controlling the load current in second semiconductor channel structures formed in the active region at the second side, wherein the second control electrodes are formed as planar electrodes in a region below, with respect to the vertical direction, the second side.

The formed first control electrodes may be arranged in said first control trenches or may alternatively also, as the second control electrodes, be formed as planar electrodes.

The above described method may be employed to produce an embodiment of the semiconductor device 1 as described above. Accordingly, embodiments of the production method correspond to the embodiments of the power semiconductor device presented above. In so far, it is referred to the aforesaid.

In an embodiment, the method is carried out with respect to a single wafer, e.g., a single thin wafer. Further, the method can be devoid of a wafer-bonding processing step.

In an embodiment, the method further comprises first method steps carried out with respect to the first side (cf. reference numeral 110) and subsequent second method steps carried out with respect to the second side (cf. reference numeral 120), e.g., after the wafer has been thinned to a final thickness and/or after the first side has been provided with a metallization for forming the first load terminal.

The method may further comprise forming, between the semiconductor body and the first load terminal and/or between the semiconductor body and the second load terminal at least one isolation layer, e.g., based on a low-temperature-oxide, LTO, processing step. For example, the LTO processing step occurs at a temperature of at most 200° C. For example, the at least one isolation layer forms at least one of the first control insulator 142-1 and the second control insulator 142-2. In particular, the second control insulator 142-2 generated based on said LTO processing step may isolate the second control electrodes 141-2 configured as planar electrodes.

Further, the method may comprise carrying out an activation processing step with respect to implanted regions in the semiconductor body based on at least one laser thermal anneal processing step, e.g., based on a melting laser processing step and/or a non-melting laser processing step. Said implanted regions may for example be provided to generate the first and/or second source regions 101-1/2. Also the second body region 102-2 may be generated based on said at least one laser thermal anneal processing step, wherein a wavelength chosen for this processing step may be significantly greater as the wavelength used for the at least one laser thermal anneal processing step carried out for generating the first and/or second source regions 101-1/2.

In a further embodiment, the production method may include a so-called multi pulse train laser anneal processing step, e.g., applied for processing the second side 120, e.g., for activating doped regions at the second side 120.

In the above, embodiments pertaining to power semiconductor device, such as IGBTs, RC IGBTs and derivatives thereof, and corresponding processing and control methods were explained. For example, these power semiconductor devices are based on silicon (Si). Accordingly, a monocrystalline semiconductor region or layer, e.g., the semiconductor body and its regions/zones, e.g., regions etc. can be a monocrystalline Si-region or Si-layer. In other embodiments, polycrystalline or amorphous silicon may be employed.

It should, however, be understood that the semiconductor body and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body coupled to a first load terminal at a first side and to a second load terminal at a second side that is opposite to the first side with respect to a vertical direction, wherein the semiconductor body has a thickness corresponding to a distance between the first side and the second side along the vertical direction, wherein the semiconductor body comprises an active region configured to conduct a load current between the first load terminal and the second load terminal;
at the first side and electrically isolated from the first load terminal and the second load terminal, first control electrodes configured to control the load current in first semiconductor channel structures formed in the active region at the first side; and
at the second side and electrically isolated from the first load terminal and the second load terminal, second control electrodes configured to control the load current in second semiconductor channel structures formed in the active region at the second side,
wherein at the second side and in a contiguous area of modified control (AMC) belonging to the active region and having a lateral extension of at least 30% of the semiconductor body thickness, either:
no second control electrodes are provided; or
the second control electrodes are less effective at removing free charge carriers out of the power semiconductor device than the second control electrodes outside the AMC.

2. The power semiconductor device of claim 1, wherein the AMC has a total horizontal area amounting to at least 20% of a total horizontal area of the active region.

3. The power semiconductor device of claim 1, wherein at the second side, the AMC is surrounded by a portion of the active region where the second control electrodes are provided or, respectively, where the second control electrodes are more effective in removing free charge carriers out of the power semiconductor device than the second control electrodes in the AMC.

4. The power semiconductor device of claim 1, wherein the AMC provides for a path for the load current between the semiconductor body and the second load terminal.

5. The power semiconductor device of claim 1, further comprising a first barrier region of a same conductivity type as a drift region of the semiconductor body, wherein the first barrier region is arranged, with respect the vertical direction, below the first semiconductor channel structures and above the drift region.

6. The power semiconductor device of claim 5, further comprising a second barrier region of the same conductivity type as the drift region, wherein the second barrier region is arranged, with respect the vertical direction, above the second semiconductor channel structures and below the drift region.

7. The power semiconductor device of claim 6, further comprising a field stop region of the same conductivity type as the drift region, wherein the field stop region is arranged between the first barrier region and the drift region and/or between the drift region and the second barrier region.

8. The power semiconductor device of claim 1, wherein the first semiconductor channel structures comprise a respective first source region of a first conductivity type electrically connected to the first load terminal, and wherein the first source regions are arranged adjacent to the first control electrodes.

9. The power semiconductor device of claim 1, wherein the semiconductor body is formed in a single semiconductor chip.

10. The power semiconductor device of claim 1, wherein the power semiconductor device is an IGBT, a bidirectional IGBT, or a reverse conducting IGBT.

11. The power semiconductor device of claim 1, wherein the second semiconductor channel structures comprise a respective second source region of a first conductivity type electrically connected to the second load terminal, and wherein the second source regions are arranged adjacent to the second control electrodes.

12. The power semiconductor device of claim 1, wherein the first control electrodes are configured to be subjected to a first control signal, and wherein the second control electrodes are configured to be subjected to a second control signal different from the first control signal.

13. The power semiconductor device of claim 12, wherein the second control electrodes are additionally provided at the first side.

14. A power semiconductor device, comprising:
a semiconductor body coupled to a first load terminal at a first side and to a second load terminal at a second side that is opposite to the first side with respect to a vertical direction, wherein the semiconductor body has a thickness corresponding to a distance between the first side and the second side along the vertical direction, wherein the semiconductor body comprises an active region configured to conduct a load current between the first load terminal and the second load terminal;
at the first side and electrically isolated from the first load terminal and the second load terminal, first control electrodes configured to control the load current in first semiconductor channel structures formed in the active region at the first side; and
at the second side and electrically isolated from the first load terminal and the second load terminal, second control electrodes configured to control the load current in second semiconductor channel structures formed in the active region at the second side,
wherein the first control electrodes are arranged in first control trenches that extend from the first side into the semiconductor body along the vertical direction, wherein the second control electrodes are formed as planar electrodes in a region below, with respect to the vertical direction, the second side, wherein at the second side and in a contiguous area of modified control (AMC) belonging to the active region and having a lateral extension of at least 30% of the semiconductor body thickness, either no second control electrodes are provided or the second control electrodes are less effective in removing free charge carriers out of the power semiconductor device than the second control electrodes outside the AMC.

15. The power semiconductor device of claim 14, wherein the AMC has a total horizontal area amounting to at least 20% of a total horizontal area of the active region.

16. The power semiconductor device of claim 14, wherein at the second side, the AMC is surrounded by a portion of the active region where the second control electrodes are provided or, respectively, where the second control electrodes are more effective in removing free charge carriers out of the power semiconductor device than the second control electrodes in the AMC.

17. The power semiconductor device of claim 14, wherein the AMC provides for a path for the load current between the semiconductor body and the second load terminal.

18. The power semiconductor device of claim 14, further comprising a first barrier region of a same conductivity type as a drift region of the semiconductor body, wherein the first barrier region is arranged, with respect the vertical direction, below the first semiconductor channel structures and above the drift region.

19. The power semiconductor device of claim 18, further comprising a second barrier region of the same conductivity type as the drift region, wherein the second barrier region is arranged, with respect the vertical direction, above the second semiconductor channel structures and below the drift region.

20. The power semiconductor device of claim 19, further comprising a field stop region of the same conductivity type as the drift region, wherein the field stop region is arranged between the first barrier region and the drift region and/or between the drift region and the second barrier region.

21. The power semiconductor device of claim 14, wherein the first semiconductor channel structures comprise a respective first source region of a first conductivity type electrically connected to the first load terminal, and wherein the first source regions are arranged adjacent to the first control electrodes.

22. The power semiconductor device of claim 14, wherein the semiconductor body is formed in a single semiconductor chip.

23. The power semiconductor device of claim 14, wherein the power semiconductor device is an IGBT, a bidirectional IGBT, or a reverse conducting IGBT.

24. The power semiconductor device of claim 14, wherein the second semiconductor channel structures comprise a respective second source region of a first conductivity type electrically connected to the second load terminal, wherein the second source regions are arranged adjacent to the second control electrodes.

25. The power semiconductor device of claim 14, wherein the first control electrodes are configured to be subjected to a first control signal, and wherein the second control electrodes are configured to be subjected to a second control signal different from the first control signal.

26. The power semiconductor device of claim 25, wherein the second control electrodes are additionally provided at the first side.

27. A method of producing a power semiconductor device, the method comprising:

forming a semiconductor body coupled to a first load terminal at a first side and to a second load terminal at a second side that is opposite to the first side with respect to a vertical direction, wherein the semiconductor body has a thickness corresponding to a distance between the first side and the second side along the vertical direction, and wherein the semiconductor body comprises an active region configured to conduct a load current between the first load terminal and the second load terminal;

at the first side and electrically isolated from the first load terminal and the second load terminal, forming first control electrodes configured to control the load current in first semiconductor channel structures formed in the active region at the first side, wherein the first control electrodes are arranged in first control trenches that extend from the first side into the semiconductor body along the vertical direction;

at the second side and electrically isolated from the first load terminal and the second load terminal, forming second control electrodes configured to control the load current in second semiconductor channel structures formed in the active region at the second side, wherein the second control electrodes are formed as planar electrodes in a region below, with respect to the vertical direction, the second side; and carrying out an activation processing step with respect to implanted regions in the semiconductor body based on at least one laser thermal anneal processing step.

28. The method of claim 27, wherein the method is carried out with respect to a single wafer.

29. The method of claim 27, wherein the method is devoid of a wafer-bonding processing step.

30. The method of claim 27, further comprising:
first method steps carried out with respect to the first side; and
subsequent second method steps carried out with respect to the second side.

31. The method of claim 27, further comprising:
forming, between the semiconductor body and the first load terminal and/or between the semiconductor body and the second load terminal, at least one isolation layer.

32. A power semiconductor device, comprising:
a semiconductor body coupled to a first load terminal at a first side and to a second load terminal at a second side that is opposite to the first side with respect to a vertical direction, wherein the semiconductor body has a thickness corresponding to a distance between the first side and the second side along the vertical direction, wherein the semiconductor body comprises an active region configured to conduct a load current between the first load terminal and the second load terminal;

at the first side and electrically isolated from the first load terminal and the second load terminal, first control electrodes configured to control the load current in first semiconductor channel structures formed in the active region at the first side;

at the second side and electrically isolated from the first load terminal and the second load terminal, second control electrodes configured to control the load current in second semiconductor channel structures formed in the active region at the second side; and a first barrier region of a same conductivity type as a drift region of the semiconductor body, wherein the first control electrodes are arranged in first control trenches that extend from the first side into the semiconductor body along the vertical direction, wherein the second control electrodes are formed as planar electrodes in a region below, with respect to the vertical direction, the second side, wherein the first barrier region is arranged, with respect the vertical direction, below the first semiconductor channel structures and above the drift region.

33. The power semiconductor device of claim 32, further comprising a second barrier region of the same conductivity type as the drift region, wherein the second barrier region is arranged, with respect the vertical direction, above the second semiconductor channel structures and below the drift region.

34. The power semiconductor device of claim 33, further comprising a field stop region of the same conductivity type as the drift region, wherein the field stop region is arranged between the first barrier region and the drift region and/or between the drift region and the second barrier region.

35. A power semiconductor device, comprising:

a semiconductor body coupled to a first load terminal at a first side and to a second load terminal at a second side that is opposite to the first side with respect to a vertical direction, wherein the semiconductor body has a thickness corresponding to a distance between the first side and the second side along the vertical direction, wherein the semiconductor body comprises an active region configured to conduct a load current between the first load terminal and the second load terminal;

at the first side and electrically isolated from the first load terminal and the second load terminal, first control electrodes configured to control the load current in first semiconductor channel structures formed in the active region at the first side; and at the second side and electrically isolated from the first load terminal and the second load terminal, second control electrodes configured to control the load current in second semiconductor channel structures formed in the active region at the second side, wherein the first control electrodes are arranged in first control trenches that extend from the first side into the semiconductor body along the vertical direction, wherein the second control electrodes are formed as planar electrodes in a region below, with respect to the vertical direction, the second side, wherein the first control electrodes are configured to be subjected to a first control signal, wherein the second control electrodes are configured to be subjected to a second control signal different from the first control signal, wherein the second control electrodes are additionally provided at the first side.

* * * * *